US012685204B2

(12) United States Patent
Wu et al.

(10) Patent No.: US 12,685,204 B2
(45) Date of Patent: Jul. 14, 2026

(54) CHIP ON FILM PACKAGE WITH MULTILAYER COMPOSITE BUMPS BONDED TO MULTIPLE LEADS ON A SUBSTRATE

(71) Applicant: CHIPBOND TECHNOLOGY CORPORATION, Hsinchu (TW)

(72) Inventors: Sheng-Jen Wu, Hsinchu County (TW); Shih-Chung Chang, Taichung City (TW); Hsueh-Shun Yeh, Hsinchu County (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 559 days.

(21) Appl. No.: 18/108,733

(22) Filed: Feb. 13, 2023

(65) Prior Publication Data

US 2023/0326896 A1    Oct. 12, 2023

(30) Foreign Application Priority Data

Apr. 7, 2022    (TW) .................................. 111113338

(51) Int. Cl.
*H10B 43/27*        (2023.01)
*G11C 11/408*      (2006.01)
(Continued)

(52) U.S. Cl.
CPC ........... *H10W 72/30* (2026.01); *H10W 72/90* (2026.01); *H10W 72/334* (2026.01);
(Continued)

(58) Field of Classification Search
CPC ............. H01L 23/498; H01L 23/49811; H01L 23/49838; H01L 23/49822;
(Continued)

(56) References Cited

U.S. PATENT DOCUMENTS 7,390,732 B1 * 6/2008 Watanabe ........... H10W 74/012
257/E23.021
7,893,533 B2 * 2/2011 Saito ................... H10W 72/012
257/781

(Continued)

FOREIGN PATENT DOCUMENTS

CN        1779959 A      5/2006
CN        101131987 A    2/2008
(Continued)

OTHER PUBLICATIONS

Korean office action mailed Jul. 1, 2024 for Korean patent application No. 10-2023-0019165, 5 pages.
(Continued)

*Primary Examiner* — Wael M Fahmy
*Assistant Examiner* — Aneesa Riaz Baig
(74) *Attorney, Agent, or Firm* — Demian K. Jackson; Jackson IPG PLLC

(57)        ABSTRACT

A COF package includes a substrate and a chip, composite bumps on the chip are bonded to leads on the substrate. Each of the composite bumps includes a raising strip, a UBM layer and a bonding layer. A bonding rib is formed on the bonding layer because of the raising strip and the UBM layer, and the bonding rib on each of the composite bumps can be inserted into each of the leads and surface-contact with each of the leads to increase weld length and bonding strength between the bonding layer and the leads and further reduce a force required for bonding the chip to the substrate in a flip-chip bonding process.

13 Claims, 4 Drawing Sheets

(51) Int. Cl.

| | |
|---|---|
| *G11C 11/412* | (2006.01) |
| *G11C 11/418* | (2006.01) |
| *H01L 21/768* | (2006.01) |
| *H01L 23/48* | (2006.01) |
| *H01L 25/00* | (2006.01) |
| *H01L 25/065* | (2023.01) |
| *H10B 41/27* | (2023.01) |
| *H10B 41/30* | (2023.01) |
| *H10B 41/35* | (2023.01) |
| *H10B 43/30* | (2023.01) |
| *H10B 43/35* | (2023.01) |
| *H10W 72/30* | (2026.01) |
| *H10W 72/59* | (2026.01) |
| *H10W 72/90* | (2026.01) |
| *H10W 90/00* | (2026.01) |

(52) U.S. Cl.
CPC ........ *H10W 72/344* (2026.01); *H10W 72/352* (2026.01); *H10W 72/383* (2026.01); *H10W 72/59* (2026.01); *H10W 72/934* (2026.01); *H10W 72/952* (2026.01); *H10W 90/734* (2026.01)

(58) Field of Classification Search
CPC ........... H01L 23/49866; H01L 21/4853; H01L 21/4857; H01L 24/13; H01L 24/15; H01L 24/26; H01L 24/29; H01L 24/32; H01L 2224/13018; H01L 2224/13019; H01L 2224/1355; H01L 2224/05075; H01L 2224/0558–05583; H01L 2224/13082–13084; H01L 2224/13582; H01L 2224/13027; H10W 72/334; H10W 72/934; H10W 72/234; H10W 72/227; H10W 72/232; H10W 72/235; H10W 72/237; H10W 72/241; H10W 72/242; H10W 72/244; H10W 72/247; H10W 72/248; H10W 72/344; H10W 72/383; H10W 70/65; H10W 70/652; H10W 70/654; H10W 72/222; H10W 72/224; H10W 72/923
See application file for complete search history.

(56) References Cited

U.S. PATENT DOCUMENTS

| | | | | |
|---|---|---|---|---|
| 2005/0236104 A1* | 10/2005 | Tanaka | ................ | H10W 72/072 156/308.2 |
| 2005/0275115 A1* | 12/2005 | Tanaka | ................... | G09G 3/006 257/786 |
| 2006/0091539 A1* | 5/2006 | Tanaka | ................ | H10W 42/121 257/784 |
| 2007/0210457 A1* | 9/2007 | Lin | ........................ | H10W 72/20 257/E23.068 |
| 2008/0023830 A1* | 1/2008 | Chang | ................... | H10W 72/20 257/737 |
| 2008/0099914 A1* | 5/2008 | Saito | ................... | H10W 72/012 257/737 |
| 2009/0242122 A1* | 10/2009 | Tanaka | ................ | H10W 72/072 156/60 |
| 2009/0305494 A1* | 12/2009 | Kwon | ................ | H10W 72/012 257/E21.575 |
| 2010/0252829 A1* | 10/2010 | Tanaka | ................... | G09G 3/006 257/E23.179 |
| 2011/0115076 A1* | 5/2011 | Yamasaki | .............. | H01L 24/11 257/E21.507 |
| 2011/0230044 A1* | 9/2011 | Chang | ................... | H10W 72/20 257/E21.508 |
| 2011/0266670 A1* | 11/2011 | England | .............. | H10W 42/121 257/773 |
| 2012/0068337 A1* | 3/2012 | Pendse | ................. | H01L 21/563 257/737 |
| 2014/0145340 A1* | 5/2014 | Pendse | ................. | H10W 20/40 438/622 |
| 2020/0266164 A1* | 8/2020 | Kwon | ................ | H10W 72/012 |
| 2022/0216177 A1* | 7/2022 | Jo | ........................ | H10K 59/131 |
| 2023/0326894 A1* | 10/2023 | Wu | ........................ | H01L 24/16 |
| 2024/0021766 A1* | 1/2024 | Wang | ................... | H10H 20/857 |

FOREIGN PATENT DOCUMENTS

| | | | |
|---|---|---|---|
| CN | 101800181 | A | 8/2010 |
| JP | 9-223721 | A | 8/1997 |
| JP | 11-045909 | A | 2/1999 |
| JP | 11-97471 | A | 4/1999 |
| JP | 2002-228707 | A | 8/2002 |
| JP | 2007-19104 | A | 1/2007 |
| KR | 10-2006-0046431 | A | 5/2006 |
| KR | 10-1897653 | B1 | 9/2018 |
| TW | 200701489 | A | 1/2007 |
| TW | 200905763 | A | 2/2009 |
| WO | 99/23696 | A1 | 5/1999 |

OTHER PUBLICATIONS

Japanese Notice of Allowance mailed Feb. 28, 2024 for Japanese Patent Application No. 2023-020744, 3 pages.
Taiwanese Office Action mailed Feb. 7, 2022 for Taiwanese Patent Application No. 111113338, 3 pages.
Chinese notice of allowance mailed Jun. 1, 2026 for Chinese patent application No. 202210420061.8, 3 pages.

* cited by examiner

CHIP ON FILM PACKAGE WITH MULTILAYER COMPOSITE BUMPS BONDED TO MULTIPLE LEADS ON A SUBSTRATE

FIELD OF THE INVENTION

This invention relates to a chip-on-film (COF) package, and more particularly to a COF package in which a chip is bonded to a substrate using a composite bump.

BACKGROUND OF THE INVENTION

Conventionally, in order to obtain a COF package, a higher bonding force is required for bonding bumps on a chip to leads on a substrate. Bump pitch is reduced owing to chip output ports are increased significantly, but bumps may be compressed to be connected to the adjacent one and cause short circuit during bonding process. Otherwise, reliability of the conventional COF package is lower because bonding strength between the bumps and the leads is insufficient.

SUMMARY

One object of the present invention is to provide a COF package in which composite bumps on a chip are provided to be bonded to leads on a substrate.

A COF package of the present invention includes a substrate and a chip, the substrate includes a plurality of leads, and the chip includes a body, a plurality of bond pads, a protective layer and a plurality of composite bumps. The bond pads are arranged on the body, a surface of the body is covered by the protective layer, the protective layer includes openings configured to expose the bond pads. Each of the composite bumps includes a first raising strip, a UBM layer and a bonding layer, the first raising strip is located on the protective layer and covered by the UBM layer, the UBM layer is electrically connected to the bond pad, covered by the bonding layer and includes a first rib located on the first raising strip. The bonding layer includes a first bonding rib located on the first rib along a first direction parallel to the surface of the body, the first bonding rib is inserted into the lead to allow the lead to generate a first restricted rib located above the bond pad.

Because of the first raising strip arranged on the protective layer, the compressive strength of the chip can be improved, and the first bonding rib can be inserted into the lead in the flip-chip bonding process to reduce the force required for bonding the chip to the substrate. After inserting into the lead, the first bonding rib can surface-contact with the lead to increase weld length of the bonding layer and the lead and increase bonding strength between the chip and the substrate.

DETAILED DESCRIPTION OF THE INVENTION

Figure 1:
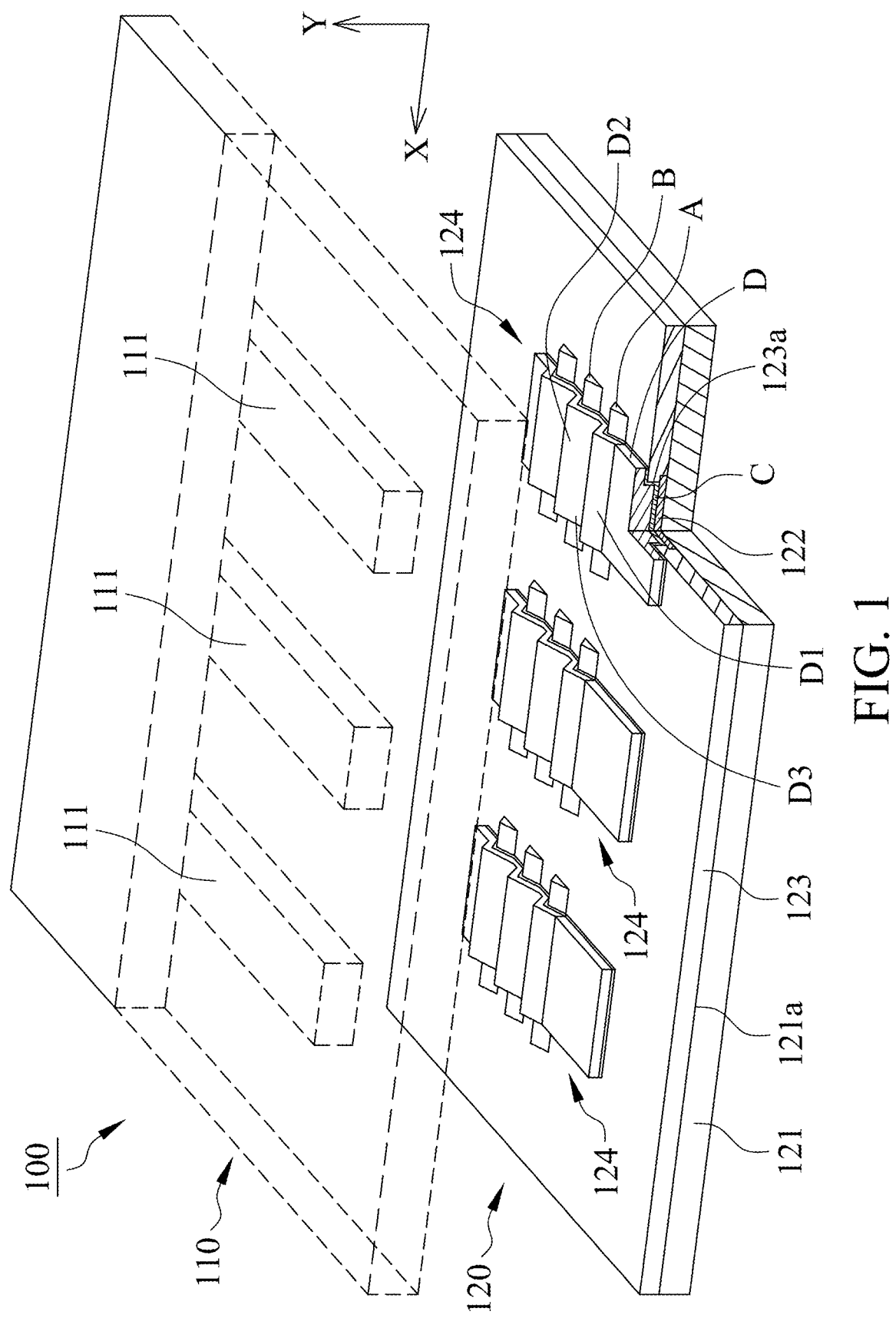
FIG. 1 is a perspective exploded diagram illustrating a COF package in accordance with one embodiment of the present invention.
Figures 2, 3:
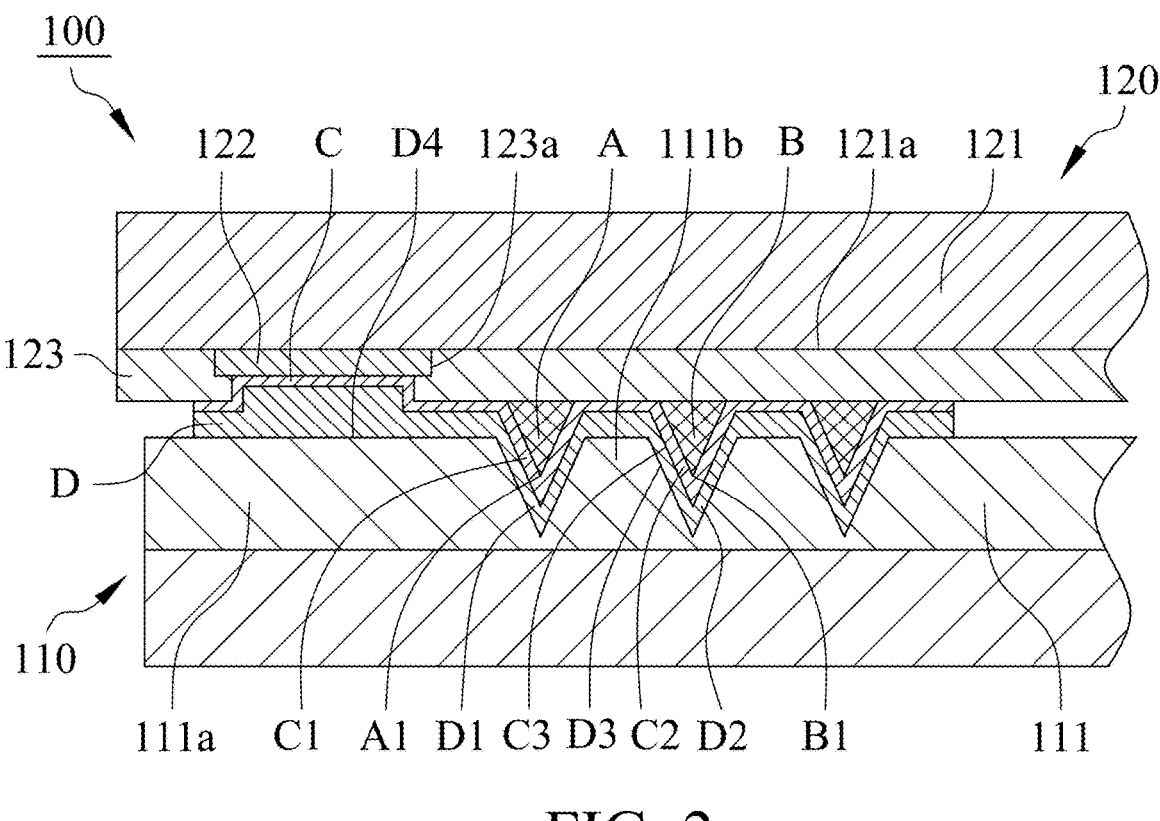
FIG. 2 is a cross-section view diagram illustrating a COF package in accordance with one embodiment of the present invention.
FIG. 3 is a cross-section view diagram illustrating a chip of a COF package in accordance with one embodiment of the present invention.

With reference to FIGS. 1 and 2, a COF package 100 in accordance with one embodiment of the present invention includes a substrate 110 and a chip 120. In a flip-chip bonding process, a plurality of composite bumps 124 on the chip 120 are bonded to a plurality of leads 111 on the substrate 110 to obtain the COF package 100. Preferably, a underfill material (not shown) is provided between the substrate 110 and the chip 120 and it may be a non-conductive film (NCF). The composite bumps 124 and the leads 111 are fully covered by the underfill material to avoid oxidation.

With reference to FIGS. 1 to 3, the chip 120 includes a body 121, a plurality of bond pads 122, a protective layer 123 and the composite bumps 124 mentioned above. The bond pads 122 are arranged on the body 121, the protective layer 123 covers a surface 121a of the body 121 and includes a plurality of openings 123a, the bond pads 122 are visible from the openings 123a one by one.

With reference to FIGS. 1 and 3, each of the composite bumps 124 includes a first raising strip A, a under bump metallization (UBM) layer C and a bonding layer D, and preferably, each of the composite bumps 124 further includes at least one second raising strip B. The first raising strip A and the second raising strip B, which may be made of polymer material, are arranged on the protective layer 123, and the first raising strip A is located between the opening 123a of the protective layer 123 and the second raising strip B. Referring to FIG. 3, there is a first gap G1 located between the first raising strip A and the second raising strip B, and in this embodiment, there is further a second gap G2 located between the first raising strip A and the opening 123a of the protective layer 123. The protective layer 123 is visible in the first gap G1 and the second gap G2.

Figures 4, 5, 6:
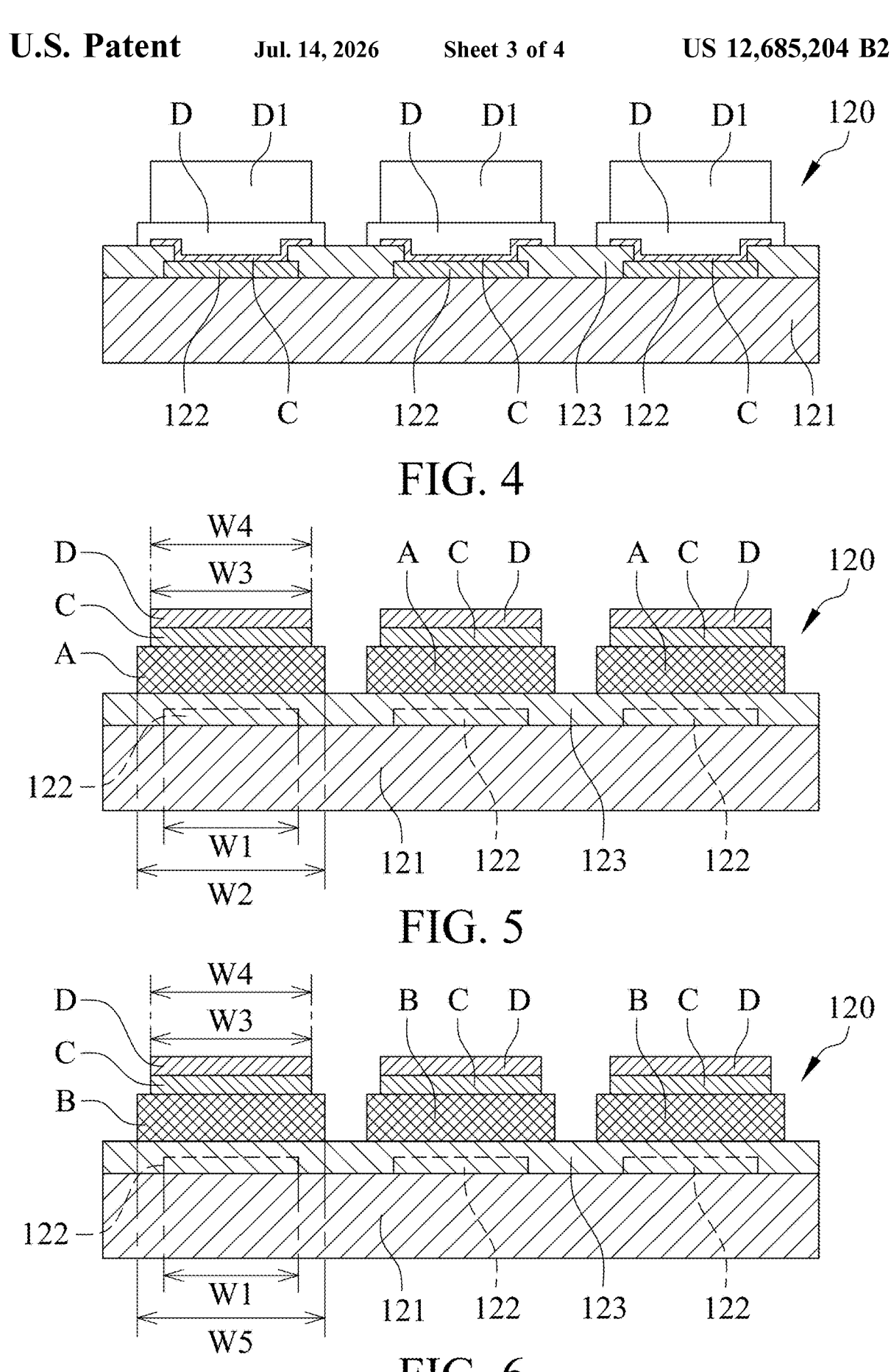
FIG. 4 is a cross-section view diagram along I-I line of FIG. 3.
FIG. 5 is a cross-section view diagram along J-J line of FIG. 3.
FIG. 6 is a cross-section view diagram along K-K line of FIG. 3.
Figure 7:
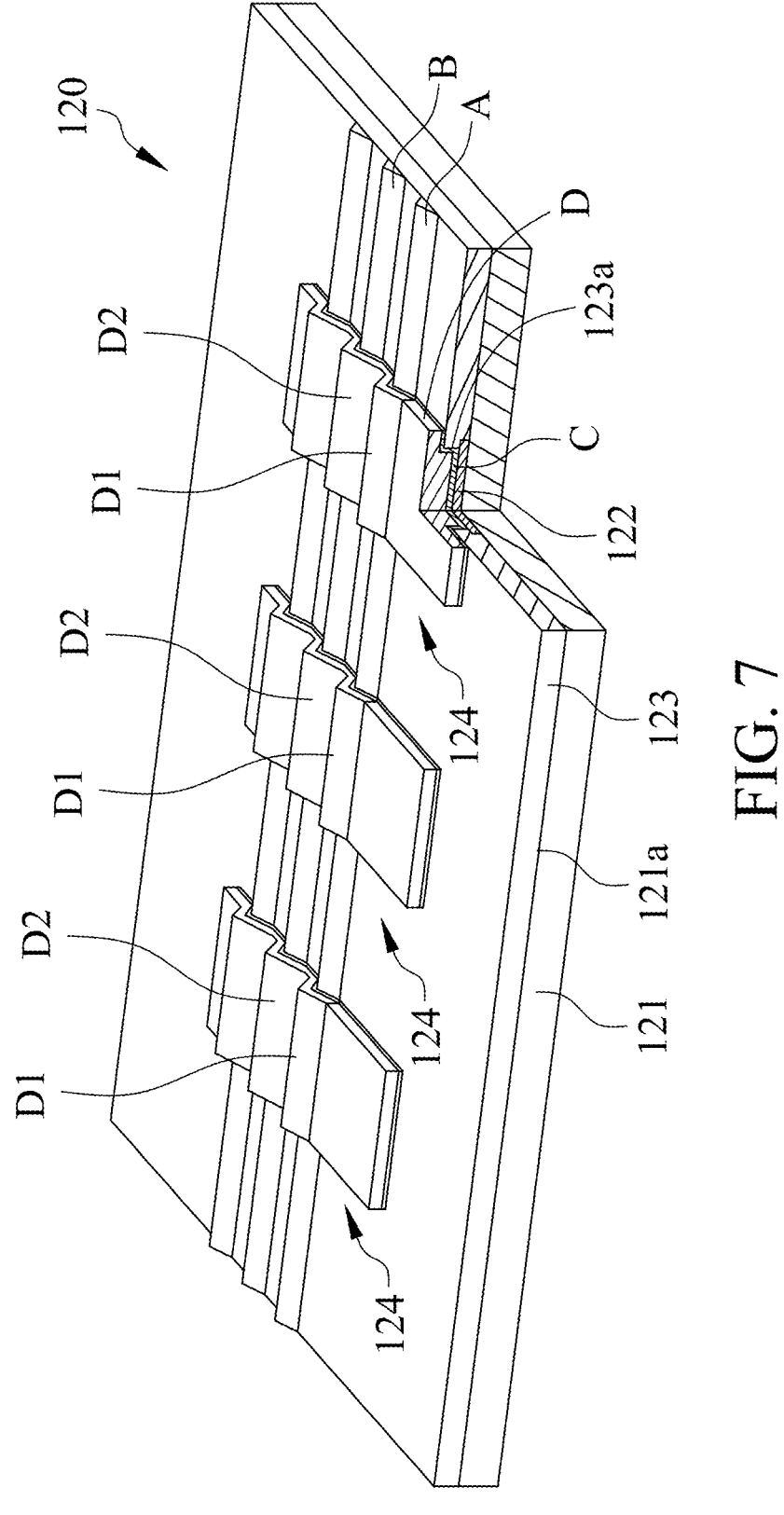
FIG. 7 is a perspective diagram illustrating a chip of a COF package in accordance with another embodiment of the present invention.

With reference to FIGS. 1, 4 and 5, along a first direction X parallel to the surface 121a of the body 121, each of the openings 123a of the protective layer 123 has a first width W1 and the first raising strip A has a second width W2. Preferably, the second width W2 is greater than or equal to the first width W1. With reference to FIGS. 1, 4 and 6, the second raising strip B has a fifth width W5 in the first direction X, and preferably, the fifth width W5 is greater than or equal to the first width W1 of the opening 123a. A chip 120 in accordance with another embodiment of the present invention is shown in FIG. 7, and in this embodiment, the first raising strips A of the adjacent composite bumps 124 are connected with each other to become a longer raising strip, and the second raising strips B of the adjacent composite bumps 124 are connected with each other to become another longer raising strip. The first raising strips A connected mutually and the second raising strips B connected mutually can increase the compressive strength of the chip 120 to prevent the chip 120 from breaking during the flip-chip bonding process, and further can increase a height of the bonding layer D.

With reference to FIGS. 1 to 3, the UBM layer C covers the first raising strip A, the second raising strip B and the protective layer 123 visible in the first gap G1, and in this embodiment, the UBM layer C further covers the protective layer 123 visible in the second gap G2. The UBM layer C includes a first rib C1 formed on the first raising strip A, a second rib C2 formed on the second raising strip B and a groove C3 located between the first raising strip A and the second raising strip B, the groove C3 is located between the first rib C1 and the second rib C2. The UBM layer C is electrically connected to the bond pad 122, and in this embodiment, the UBM layer C covers the bond pad 122. The UBM layer C may be a single metal layer or multiple metal layers, and may be made of titanium (Ti), tungsten titanium (TiW), copper (Cu), nickel (Ni), gold (Au) or nickel vanadium (NiV).

With reference to FIGS. 1 to 3, the bonding layer D covers the UBM layer C and includes a first bonding rib D1 formed on the first rib C1, a second bonding rib D2 formed on the second rib C2 and a restriction groove D3 located within the groove C3 along the first direction X, the restriction groove D3 is located between the first bonding rib D1 and the second bonding rib D2. In this embodiment, the bonding layer D covers the UBM layer C located in the opening 123a of the protective layer 123, and it may be made of gold (Au), copper (Cu), tin (Sn), gold/tin alloy (Au/Sn), tin-silver alloy (Sn/Ag), indium (In), bismuth/tin alloy (Bi/Sn) or tin/lead alloy (Sn/Pb).

With reference to FIGS. 1 and 3, in a second direction Y vertical to the surface 121a of the body 121, the height from a terminal A1 of the first raising strip A to the surface 121a of the body 121 is referred as a first height H1, and the height from a terminal D4 of the bonding layer D located over the bond pad 122 to the surface 121a of the body 121 is referred as a second height H2 which is less than the first height H1. In this embodiment, the height from a terminal B1 of the second raising strip B to the surface 121a of the body 121 in the second direction Y is referred as a third height H3 which is substantially equal to the first height H1.

With reference to FIGS. 1, 5 and 6, the UBM layer C located on the first raising strip A and the second raising strip B has a third width W3 in the first direction X, and the third width W3 of the UBM layer C is less than or equal to the second width W2 of the first raising strip A and is less than or equal to the fifth width W5 of the second raising strip B. The bonding layer D located on the first rib C1 and the second rib C2 has a fourth width W4 in the first direction X, and the fourth width W4 of the bonding layer D is greater than or equal to the third width W3 of the UBM layer C.

With reference to FIGS. 1 to 3, the first bonding rib D1 on the composite bump 124 is designed to be inserted into the lead 111 during the flip-chip bonding process such that the chip 120 can be electrically connected to the substrate 110. And in this embodiment, the first bonding rib D1 and the second bonding rib D2 on the composite bump 124 are inserted into the lead 111 to allow the chip 120 to be electrically connected to the substrate 110. Owing to the first height H1 of the first raising strip A is higher than the second height H2 of the bonding layer D located above the bond pad 122 and substantially equal to the third height H3 of the second raising strip B, a first restricted rib 111a located above the bond pad 122 and a second restricted rib 111b located within the restriction groove D3 are formed on the lead 111. The second restricted rib 111b is restricted between the first bonding rib D1 and the second bonding rib D2 and can increase the bonding strength of chip 120 to the substrate 110 to avoid the chip 120 from separating from the substrate 110.

With reference to FIGS. 1 to 3, the first raising strip A and the second raising strip B on the protective layer 123 are provided to increase the compression strength of the chip 120 and protect the chip 120 from breaking during the flip-chip bonding process. The first bonding rib D1 and the second bonding rib D2 generated by the first raising strip A, the second raising strip B, the UBM layer C and the bonding layer D can be inserted into the lead 111 during the flip-chip bonding process, thus the force applied on the chip 120 and the substrate 110 for bonding can be reduced to avoid the compressed bumps from expanding outwardly to connect with the adjacent one and cause short circuit during the flip-chip bonding process.

The first bonding rib D1 and the second bonding rib D2 inserting into the lead 111 can surface-contact with the lead 111 to increase weld length of the bonding layer D and the lead 111 and increase bonding strength between the chip 120 and the substrate 110.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A chip-on-film package comprising:
   a substrate including a plurality of leads; and
   a chip including a body, a plurality of bond pads, a protective layer and a plurality of composite bumps, the plurality of bond pads are arranged on the body, a surface of the body is covered by the protective layer, the protective layer includes a plurality of openings, each of the plurality of openings is configured to expose one of the plurality of bond pads, each of the plurality of composite bumps includes a first raising strip, a under bump metallization (UBM) layer and a bonding layer, the first raising strip is located on the protective layer and covered by the UBM layer, the UBM layer of each of the plurality of composite bumps is electrically connected to one of the plurality of bond pads, covered by the bonding layer and includes a first rib located on the first raising strip, the bonding layer includes a first bonding rib located on the first rib along a first direction parallel to the surface of the body, the first bonding rib of the bonding layer of each of the plurality of composite bumps is configured to be inserted into one of the plurality of leads to allow each of the plurality of leads to include a first restricted rib located above each of the plurality of bond pads,
   wherein each of the plurality of composite bumps further includes a second raising strip which is located on the protective layer, the first raising strip is located between one of the plurality of openings of the protective layer and the second raising strip, the protective layer is exposed by a first gap which is located between the first and second raising strips, the second raising strip and the protective layer which is exposed by the first gap are covered by the UBM layer, the UBM layer further includes a second rib located on the second raising strip and a groove located between the first and second raising ribs and located between the first and second ribs, the bonding layer further includes a second bonding rib located on the second rib and a restriction groove located within the groove along the first direction, the restriction groove is located between the first and second bonding ribs, the second bonding rib on each of the plurality of composite bumps is configured to be inserted into one of the plurality of leads to allow each of the plurality of leads to include a second restricted rib located within the restriction groove, the second restricted rib is restricted between the first and second bonding ribs.

2. The chip-on-film package in accordance with claim 1, wherein each of the plurality of openings has a first width, the first raising strip has a second width and the UBM layer located on the first raising strip has a third width in the first direction, the second width is greater than or equal to the first width, and the third width is less than or equal to the second width.

3. The chip-on-film package in accordance with claim 2, wherein the bonding layer located on the first rib has a fourth width in the first direction, the fourth width is greater than or equal to the third width of the UBM layer located on the first raising strip.

4. The chip-on-film package in accordance with claim 1, wherein each of the plurality of openings has a first width, the first raising strip has a second width and the UBM layer located on the first raising strip has a third width in the first direction, the second width is greater than or equal to the first width, and the third width is less than or equal to the second width.

5. The chip-on-film package in accordance with claim 4, wherein the bonding layer located on the first rib has a fourth width in the first direction, the fourth width is greater than or equal to the third width of the UBM layer located on the first raising strip.

6. The chip-on-film package in accordance with claim 1, wherein each of the plurality of openings has a first width, the UBM layer located on the second raising strip has a third width, the bonding layer located on the second rib has a fourth width and the second raising strip has a fifth width in the first direction, the fifth width is greater than or equal to the first width, the third width is less than or equal to the fifth width, and the fourth width is greater than or equal to the third width.

7. The chip-on-film package in accordance with claim 1, wherein the protective layer is exposed by a second gap which is located between the first raising strip and one of the plurality of openings, each of the plurality of bond pads and the protective layer exposed by the second gap are covered by the UBM layer, the UBM layer located within each of the plurality of openings is covered by the bonding layer, a first height from a terminal of the first raising strip to the surface of the body is greater than a second height from a terminal of the bonding layer located above each of the plurality of bond pads to the surface of the body in a second direction vertical to the surface of the body.

8. The chip-on-film package in accordance with claim 1, wherein the protective layer is exposed by a second gap which is located between the first raising strip and one of the plurality of openings, each of the plurality of bond pads and the protective layer exposed by the second gap are covered by the UBM layer, the UBM layer located within each of the plurality of openings is covered by the bonding layer, a first height from a terminal of the first raising strip to the surface of the body is greater than a second height from a terminal of the bonding layer located above each of the plurality of bond pads to the surface of the body in a second direction vertical to the surface of the body.

9. The chip-on-film package in accordance with claim 1, wherein the protective layer is exposed by a second gap which is located between the first raising strip and one of the plurality of openings, each of the plurality of bond pads and the protective layer exposed by the second gap are covered by the UBM layer, the UBM layer located within each of the plurality of openings is covered by the bonding layer, a first height from a terminal of the first raising strip to the surface of the body is greater than a second height from a terminal of the bonding layer located above each of the plurality of bond pads to the surface of the body in a second direction vertical to the surface of the body, the first height is equal to a third height from a terminal of the second raising strip to the surface of the body in the second direction.

10. The chip-on-film package in accordance with claim 1, wherein the first raising strips of the adjacent composite bumps are connected in the first direction.

11. The chip-on-film package in accordance with claim 1, wherein the second raising strips of the adjacent composite bumps are connected in the first direction.

12. A chip-on-film package comprising:
a substrate including a plurality of leads; and
a chip including a body, a plurality of bond pads, a protective layer and a plurality of composite bumps, the plurality of bond pads are arranged on the body, a surface of the body is covered by the protective layer, the protective layer includes a plurality of openings, each of the plurality of openings is configured to expose one of the plurality of bond pads, each of the plurality of composite bumps includes a first raising strip, a under bump metallization (UBM) layer and a bonding layer, the first raising strip is located on the protective layer and covered by the UBM layer, the UBM layer of each of the plurality of composite bumps is electrically connected to one of the plurality of bond pads, covered by the bonding layer and includes a first rib located on the first raising strip, the bonding layer includes a first bonding rib located on the first rib along a first direction parallel to the surface of the body, the first bonding rib of the bonding layer of each of the plurality of composite bumps is configured to be inserted into one of the plurality of leads to allow each of the plurality of leads to include a first restricted rib located above each of the plurality of bond pads,
wherein each of the plurality of openings has a first width, the first raising strip has a second width and the UBM layer located on the first raising strip has a third width in the first direction, the second width is greater than or equal to the first width, and the third width is less than or equal to the second width.

13. The chip-on-film package in accordance with claim 12, wherein the bonding layer located on the first rib has a fourth width in the first direction, the fourth width is greater than or equal to the third width of the UBM layer located on the first raising strip.

* * * * *